(12) United States Patent
Kunihiro et al.

(10) Patent No.: US 8,902,001 B2
(45) Date of Patent: Dec. 2, 2014

(54) POWER SUPPLY DEVICE AND POWER AMPLIFICATION APPARATUS USING SAME

(75) Inventors: Kazuaki Kunihiro, Tokyo (JP); Yasushi Watanabe, Tokyo (JP)

(73) Assignee: NEC Corporation, Tokyo (JP)

( * ) Notice: Subject to any disclaimer, the term of this patent is extended or adjusted under 35 U.S.C. 154(b) by 24 days.

(21) Appl. No.: 13/697,833

(22) PCT Filed: May 13, 2011

(86) PCT No.: PCT/JP2011/061599
§ 371 (c)(1),
(2), (4) Date: Nov. 14, 2012

(87) PCT Pub. No.: WO2011/145710
PCT Pub. Date: Nov. 24, 2011

(65) Prior Publication Data
US 2013/0057340 A1  Mar. 7, 2013

(30) Foreign Application Priority Data
May 18, 2010  (JP) .................................. 2010-113793

(51) Int. Cl.
H03G 3/20  (2006.01)
H03F 1/02  (2006.01)
H03F 1/32  (2006.01)
H03F 3/24  (2006.01)
H02M 3/335  (2006.01)

(52) U.S. Cl.
CPC ......... H03F 1/0211 (2013.01); H02M 3/33523 (2013.01); H03F 1/32 (2013.01); H03F 3/24 (2013.01); H03F 1/0227 (2013.01)
USPC ....................................................... 330/127

(58) Field of Classification Search
USPC ........................................... 330/10, 127, 136
See application file for complete search history.

(56) References Cited

U.S. PATENT DOCUMENTS 5,905,407 A    5/1999  Midya
8,237,499 B2 * 8/2012  Chen et al. .................... 330/136
(Continued)

FOREIGN PATENT DOCUMENTS

JP   2003533116 A   11/2003
JP   2005064614 A    3/2005
(Continued)

OTHER PUBLICATIONS

The international search report for PCT/JP2011/061599 mailed on Aug. 2, 2011.
(Continued)

*Primary Examiner* — Steven J Mottola
(74) *Attorney, Agent, or Firm* — Sughrue Mion, PLLC

(57) ABSTRACT

Provided are a highly efficient, low waveform distortion power supply device and a power amplifying apparatus with high efficiency and high linearity using the device as a power supply.

A power supply device of the present invention comprises a linear amplifier unit 400 which linearly amplifies an input signal and outputs it as an electric current Ic, and a switching amplification control unit 500, which outputs an electric current Im using a plurality of switching amplifying units 601, 602, ... 60n for outputting respective predetermined voltages on the basis of the magnitude of the electric current Ic outputted from said linear amplifier unit 400; and it generates an output voltage Vout according to the waveform of the input signal, and outputs an electric current Iout which is a combination of the electric currents Ic and Im.

11 Claims, 17 Drawing Sheets

(56) References Cited

U.S. PATENT DOCUMENTS

| | | |
|---|---|---|
| 2002/0008574 A1 | 1/2002 | Mathe et al. |
| 2011/0031953 A1 | 2/2011 | Kanbe et al. |
| 2011/0163822 A1 | 7/2011 | Yamanouchi et al. |

FOREIGN PATENT DOCUMENTS

| | | |
|---|---|---|
| JP | 2009189215 A | 8/2009 |
| JP | 2010016794 A | 1/2010 |
| WO | 2009101905 A1 | 8/2009 |
| WO | 2010044346 A1 | 4/2010 |

OTHER PUBLICATIONS

PCT/ISA/237 for PCT/JP2011/061599.
Proceedings of IRE, vol. 40, 1952, pp. 803-806 and Fig. 2.
2000 IEEE MTT-S Digest, vol. 2, pp. 873-876 and Fig. 1.
2004 IEEE MTT-S Digest, vol. 3, pp. 1543-1546 and Fig. 6.

* cited by examiner

OPERATIONAL AMPLIFIER CURRENT Ic

SWITCHING VOLTAGE Vsw

SWITCHING CURRENT Im

OPERATIONAL AMPLIFIER CURRENT Ic

SWITCHING VOLTAGE Vsw

SWITCHING CURRENT Im

POWER SUPPLY DEVICE AND POWER AMPLIFICATION APPARATUS USING SAME

TECHNICAL FIELD

The present invention mainly relates to an electrical power amplification apparatus used in a transmitter of wireless communication, and in particular, to a power supply device with a function of changing its output voltage according to the magnitude of an input signal, and to a power amplification apparatus using the power supply device.

BACKGROUND ART

Background Art

In recent wireless communication such as of a cellular phone and a wireless LAN (Local Area Network), modulation formats such as QPSK (Quadrature Phase Shift Keying) and QAM (Quadrature Amplitude Modulation) are applied as a digital modulation method. In such modulation formats, the locus of a signal generally involves amplitude modulation at a transition between symbols, and a high frequency modulated signal superposed on a microwave-band carrier signal shows change with time in its amplitude (envelope). In such cases, the ratio of peak power to average power of a high frequency modulated signal is referred to as PAPR (Peak-to-Average Power Ratio).

When amplifying a signal with a large PAPR value, it is necessary, in order to secure high linearity, to supply a sufficiently high power from a power supply to an amplifier so as not to cause waveform distortion even at a peak power. In other words, it is necessary to cause an amplifier to operate with a margin (back-off) in a power region sufficiently lower than a saturation power, which is limited by power supply voltage. In general, a linear amplifier in A class or B class operation shows a maximum power efficiency at around its saturation output power, and accordingly the average efficiency becomes low when it is operated in a region of large back-off.

In an OFDM (Orthogonal Frequency Division Multiplexing) method using multiple carriers, which is employed in a next-generation cellular phone, wireless LAN and digital television broadcasting, PAPR tends to increase and average efficiency of an amplifier thus reduces further. Accordingly, it is desirable that an amplifier has a characteristic of high efficiency even in a power region of large back-off.

As a method of enabling highly efficient signal amplification over a wide dynamic range in a power region of large back-off, non-patent document 1 describes a transmission method referred to as EER (Envelope Elimination and Restoration). As a method similar to the EER method, one referred to as ET (Envelope Tracking) is also known. An example of it is described in, for example, non-patent document 2.

In a modulation power supply device employed in EER and ET methods, in general, an amplitude component is converted into a pulse modulation signal, and then switching-amplified by the use of a D class amplifier or the like. However, in order to achieve a modulation power supply device with a wide bandwidth, high-power, high-speed switching amplification is needed. In this respect, as a method of modulating a power supply at high efficiency over wide bandwidth, proposed was a technology where a wide-bandwidth, low-efficiency linear amplifier unit and a narrow-bandwidth, high-efficiency switching converter cooperate, whose example is described in non-patent document 3.

FIG. 16 shows a configuration of a modulation power supply device described in non-patent document 3. In the modulation power supply device shown in FIG. 16, by using cooperation between a linear amplifier unit 70, which is of wide bandwidth but low efficiency, and a switching converter unit 71, which is of narrow bandwidth but high efficiency, an output voltage 72 of high efficiency and wide bandwidth is supplied to a power amplifier 73.

When an amplitude modulation component 74 is inputted to the linear amplifier unit 70 composed of an operational amplifier 75, an output current Ic of the linear amplifier unit 70 is converted into voltage at a current detection unit 77, and the resulting voltage is inputted to a hysteresis comparator 78. At that time, by selecting the polarity of the hysteresis comparator 78 such that its output becomes High and Low when current flows out from (Ic>0) and flows into (Ic<0) the linear amplifier unit 70, respectively, the output becomes a pulse width modulated signal 79 according to the magnitude of the amplitude modulation component 74. This pulse width modulated signal 79 is used as a control signal of a switching element 80.

The switching element 80 constitutes a switching converter together with a diode 81. When the pulse width modulated signal 79 is High, the switching element 80 enters the ON state (conducting state), and thus causes an output current Im to flow from a power supply V1 toward the power amplifier 73, which is a load. On the other hand, when the pulse width modulated signal 79 is Low, the switching element 80 enters the OFF state (non-conducting state). At that time, in order to hold current flowing through an inductor 83, the output current Im is outputted from ground (hereinafter, described as GND) via the diode 81.

Then, the modulation power supply device of non-patent document 3 combines the output currents Im and Ic, and supplies a resulting output current Tout to the power amplifier 73. By repeating the switching operation described above, to the power amplifier 73, the output current Iout is mainly supplied alternately from the power supply V1 and from GND.

An alternative power supply circuit for modulating a power supply at high efficiency over wide bandwidth is proposed in patent document 1. FIG. 17 shows a configuration of a power supply circuit of patent document 1, which is obtained by modifying a part of the configuration of the modulation power supply device of non-patent document 3 shown in FIG. 16. In FIG. 17, a first switching converter unit 94 and a second switching converter unit 95 are arranged in parallel. In this case, the inductance of an inductor 96 constituting the first switching converter unit 94 is set at a smaller value than that of an inductor 97 constituting the second switching converter unit 95. Further, the hysteresis width of a first hysteresis comparator 98 is set at a larger value than that of a second hysteresis comparator 99.

By using this configuration, when the slew rate of an amplitude modulation component is low, the second switching converter unit 95 operates at a relatively slow switching speed. On the other hand, when the slew rate of an amplitude modulation component is high, the first switching converter unit 94 performs high speed switching operation, in addition to the operation by the second switching converter unit 95. That is, by switching the inductors according to the slew rate of an amplitude modulation component, the power supply circuit of patent document 1 holds a certain degree of high efficiency even for a wide bandwidth input signal.

PRIOR ART DOCUMENT

Patent Document

Patent Document 1: Japanese Patent Application Laid-Open No. 2009-189215 (paragraphs "0015"-"0018" and "0037").

Non-Patent Document

Non-Patent Document 1: Proceedings of IRE, vol. 40, 1952, pp. 803-806 and FIG. 2.
Non-patent document 2: 2000 IEEE MTT-S Digest, Vol. 2, pp. 873-876 and FIG. 1.
Non-patent document 3: 2004 IEEE MTT-S Digest, Vol. 3, pp. 1543-1546 and FIG. 6.

BRIEF SUMMARY OF THE INVENTION

Problems to be Solved by the Invention

However, when the modulation power supply device of non-patent document 3 is applied to a high power apparatus such as, for example, a cellular phone base station, the power supply voltage V1 becomes tens of volts, but in general, high-speed, low-loss switching of such a large amplitude signal is difficult.

On the other hand, in the configuration shown in patent document 1, as the power supply voltages V1 and V2, an equivalent voltage to a desired output voltage needs to be applied. For example, when applying it to a high power apparatus such as a cellular phone base station, the power supply voltages V1 and V2 become tens of volts, but in general, high-speed, low-loss switching of such a large amplitude signal is difficult.

Further, because even when the first switching converter unit 94 is not in operation, current from an operational amplifier 101 keeps flowing through a current detection unit 103 of the first switching converter unit, there is an increase in loss by the amount due to that.

In view of the problems described above, the objective of the present invention is to provide a power supply device with high efficiency and low waveform distortion, and a power amplifying apparatus with high efficiency and high linearity in which the power supply device is used as a power supply.

Means for Solving the Problems

In order to achieve the above-described objective, a power supply device according to the present invention comprises a linear amplifier unit which linearly amplifies an input signal and outputs it as an electric current Ic and a switching amplification control unit which outputs an electric current Im using a plurality of switching amplifying units for outputting respective predetermined voltages on the basis of the magnitude of the electric current Ic outputted from said linear amplifier unit. Then, it generates an output voltage according to a waveform of the input signal, and outputs an electric current Tout which is a combination of the electric current Ic and the electric current Im.

Also in order to achieve the above-described objective, a power amplifying apparatus according to the present invention is a power amplifying apparatus for amplifying a modulated input signal including an amplitude modulation component and a phase modulation component, and is characterized by that it comprises a power supply device which outputs an output voltage Vout when the amplitude modulation component is inputted as an input signal, and a high frequency amplifier which operates, using the output voltage Vout outputted from the power supply device as a power source, to amplify the modulated input signal and output the amplified signal.

Effect of the Invention

According to the present invention, it is possible to obtain a power supply device with high efficiency and low waveform distortion, and a power amplifying apparatus with high efficiency and high linearity which uses the power supply device.

MODE FOR CARRYING OUT THE INVENTION

First Exemplary Embodiment

Figure 1:
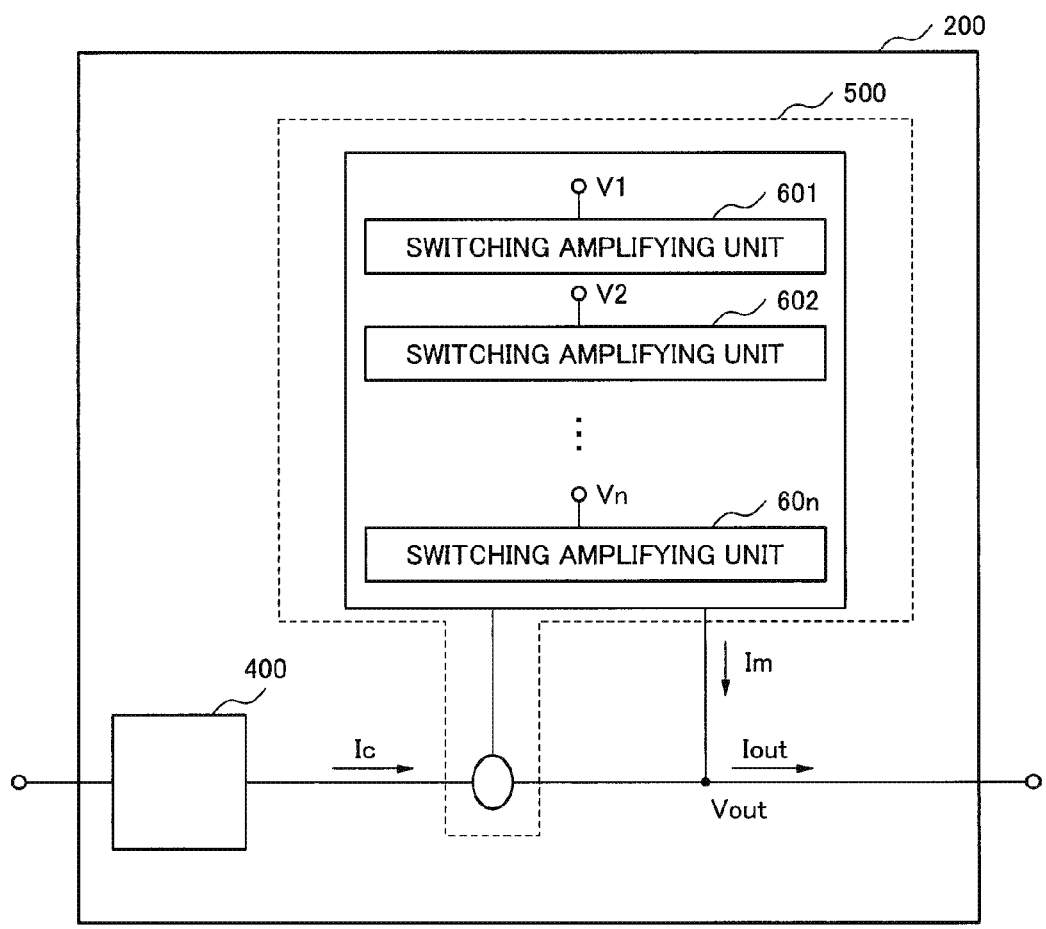
FIG. 1 an example of a block configuration diagram of a power supply device 200 according to a first exemplary embodiment of the present invention.

A first exemplary embodiment will be described below. FIG. 1 shows an example of a block configuration diagram of a power supply device according to the present exemplary embodiment. In FIG. 1, a power supply device 200 comprises a linear amplifier unit 400 and a switching amplification control unit 500, and generates an output voltage Vout according to the waveform of an inputted signal and outputs a current Iout.

The linear amplifier unit 400 linearly amplifies an input signal inputted to the power supply device 200, and thus outputs a current Ic. As the linear amplifier unit 400, for example, a voltage follower and a negative feedback amplifier can be adopted.

The switching amplification control unit 500 comprises n number of switching amplifying sections 601, 602, ... 60n (n: a natural number equal to or larger than 2). The switching amplifying sections 601, 602, ...., 60n output predetermined voltages V1, V2, ... Vn, respectively, when they are ON.

The switching amplification control unit 500 holds a predetermined lower limit value, and detects a magnitude of the current Ic outputted from the linear amplifier unit 400. When the current Ic is larger than the lower limit value, the switching amplification control unit 500 switches on or off the switching amplifying sections 601, 602, ...., 60n on the basis of the magnitude of the current Ic, and outputs a current Im which is based on voltages outputted from the switching amplifying units switched on. On the other hand, when the current Ic is smaller than the lower limit value, the switching amplification control unit 500 switches off all of the switching amplifying units, and outputs the current Im from ground (hereafter, described as GND).

In the present exemplary embodiment, when the current Ic is larger than the lower limit value, the switching amplification control unit 500 switches on a small number of switching amplifying units if the slew rate of an input signal is low, and switches on a large number of switching amplifying units if the slew rate is high. For example, when the slew rate of an input signal is low, the switching amplification control unit 500 switches on only the switching amplifying section 601, and it outputs the current Im with a slew rate according to the voltage V1. On the other hand, when the slew rate of an input signal is high, the switching amplification control unit 500 switches on all of the switching amplifying sections 601, 602, ...., 60n, and outputs the current Im with a slew rate according to a summed-up voltage Vsw=(V1+V2+ ... +Vn).

Then, the power supply device 200 according to the present exemplary embodiment outputs a current Tout which is a combination of the current Ic outputted from the linear amplifier unit 400 and the current Im outputted from the switching amplification control unit 500.

As described above, depending on the magnitude of an input signal, the power supply device 200 according to the present exemplary embodiment switches between the switching amplifying units and GND, and further adjusts the number of switching amplifying units switched on. When the slew rate of an input signal is low, the power supply device 200 can increase its efficiency by switching off unnecessary switching amplifying units, and when the slew rate of an input signal is high, it can follow even a steep peak by switching on a necessary number of switching amplifying units. Accordingly, it is possible to provide the power supply device 200 with high efficiency and low waveform distortion.

Figure 2:
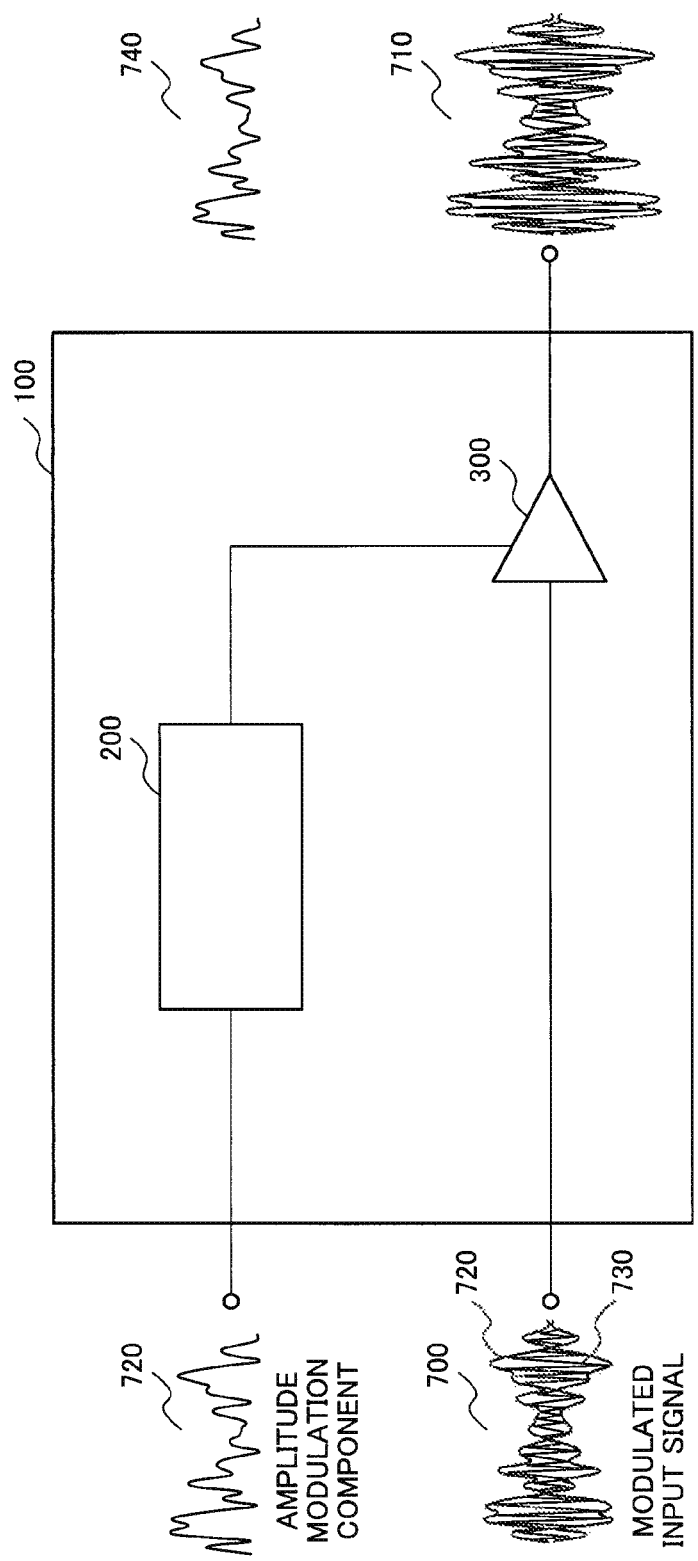
FIG. 2 an example of a block configuration diagram of a power amplifying apparatus 100 according to the first exemplary embodiment of the present invention.

Next, description will be given of a power amplifying apparatus comprising the power supply device 200 described above as a power supply. FIG. 2 shows an example of a block configuration diagram of the power amplifying apparatus. In FIG. 2, a power amplifying apparatus 100 comprises the power supply device 200 and a high frequency amplifier 300, and amplifies a modulated input signal 700 including an amplitude modulation component 720 and a phase modulation component 730, and thus outputs a high frequency modulated signal 710.

The power supply device 200 shown in FIG. 1 can be adopted as it is as the present power supply device 200, and when the amplitude modulation component 720 of the modulated input signal 700 is inputted as an input signal, the power supply device 200 generates an output voltage Vout according to a waveform of the amplitude modulation component 720, and outputs the current Tout which is a combination of the current Ic and the current Im.

The high frequency amplifier 300 operates using the output voltage Vout outputted from the power supply device 200 as a power source, and thus amplifies the inputted modulated input signal 700 and outputs the high frequency modulated signal 710.

In the power amplifying apparatus 100 according to the present exemplary embodiment, because only a minimum necessary amount of power is supplied from the power supply device 200 to the high frequency amplifier 300, the high frequency modulated signal 710 can be outputted efficiently. Further, even when a slew rate of the amplitude modulation component 720 is high, because a sufficient amount of power following a steep peak is supplied from the power supply device 200 to the high frequency amplifier 300, the power amplifying apparatus 100 can keep high linearity. Accordingly, it is possible to provide the power amplifying apparatus 100 with high efficiency and high linearity.

Second Exemplary Embodiment

Figure 3:
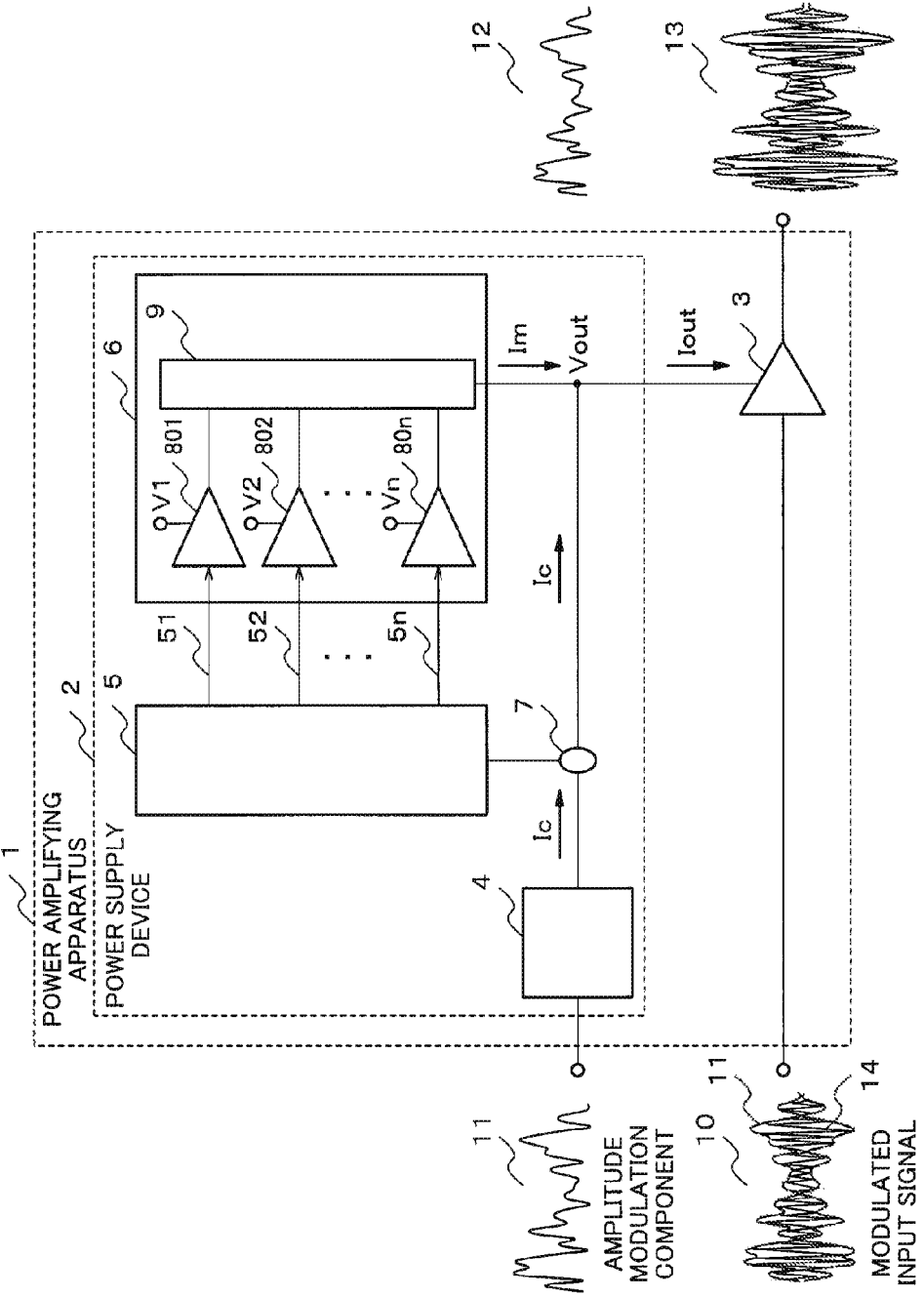
FIG. 3 an example of a circuit diagram of a power amplifying apparatus 1 according to a second exemplary embodiment of the present invention.

A second exemplary embodiment will be described below. FIG. 3 shows an example of a circuit diagram of a power supply device according to the present exemplary embodiment and a power amplifying apparatus using the device. A power amplifying apparatus 1 according to the present exemplary embodiment comprises a power supply device 2 and a power amplifier 3 (a load of the power supply device 2).

The power supply device 2 comprises a linear amplifier unit 4, a control signal generation unit 5, a switching amplifying unit 6 and a current detection unit 7. The switching amplifying unit 6 comprises at least two or more switching amplifiers 801, 802, ...., 80n (n: a natural number equal to or larger than 2) and a combining unit 9.

When a modulated input signal 10 including an amplitude modulation component 11 and a phase modulation component 14 is inputted to the power amplifying apparatus 1, the modulated input signal 10 is inputted to the power amplifier 3, and the amplitude modulation component 11 to the power supply device 2. The linear amplifier unit 4 linearly amplifies the amplitude modulation component 11 of the modulated input signal 10 inputted to the power supply device 2, and thus outputs an output current Ic. The current detection unit 7 detects a flow direction and a magnitude of the output current Ic outputted from the linear amplifier unit 4, and outputs the result to the control signal generation unit 5.

When the output current Ic is larger than a predetermined lower limit value, the control signal generation unit 5 generates, on the basis of the magnitude of the output current Ic, High or Low control signals 51, 52, ...., 5n (n: a natural number equal to or larger than 2), and outputs them to respectively corresponding switching amplifiers 801, 802, ..., 80n. Here, the control signal generation unit 5 holds threshold values different for each of the switching amplifiers 801, 802, ..., 80n, and generates High or Low control signals by comparison with the threshold values. All of the n number of threshold values are larger than the lower limit value described above.

On the other hand, when the output current Ic is smaller than the lower limit value, the control signal generation unit 5 generates the control signals 51, 52, ..., 5n which all are of Low, and outputs them to respectively corresponding switching amplifiers 801, 802, ..., 80n.

On receiving High and Low control signals, the switching amplifiers 801, 802, ..., 80n enter the ON and OFF states, respectively. Switching amplifiers in the ON state operate with power sources of supply voltages V1, V2, ..., Vn, respectively, and they output pulse output voltages to the combining unit 9.

The combining unit 9 sums up the pulse output voltages outputted from the switching amplifiers, and it outputs a current Im with a slew rate according to the summed-up voltage value.

The power supply device 2 connects an output terminal of an output port of the combining unit 9 and an output terminal of an output port of the linear amplifier unit 4, and adding the output currents Im and Ic from them, it supplies an output current Tout to the power amplifier 3, which is a load.

The power amplifier 3 operates using as a power source an output voltage (Vout) 12 from the power supply device 2 of when the amplitude modulation component 11 of the modulated input signal 10, which includes the amplitude modulation component 11 and the phase modulation component 14, is inputted, and amplifies the modulated input signal 10 and thus outputs a high frequency modulated signal 13. Further, using the output voltage (Vout) 12 from the power supply device 2, the power amplifier 3 performs linear amplification of class A, class AB or the like, or switching mode amplification of class E, class F, class D or the like, and thus outputs the high frequency modulated signal 13 whose amplitude and phase are modulated. By this sequence of operations, output voltage is changed according to the magnitude of an input signal.

Figure 4:
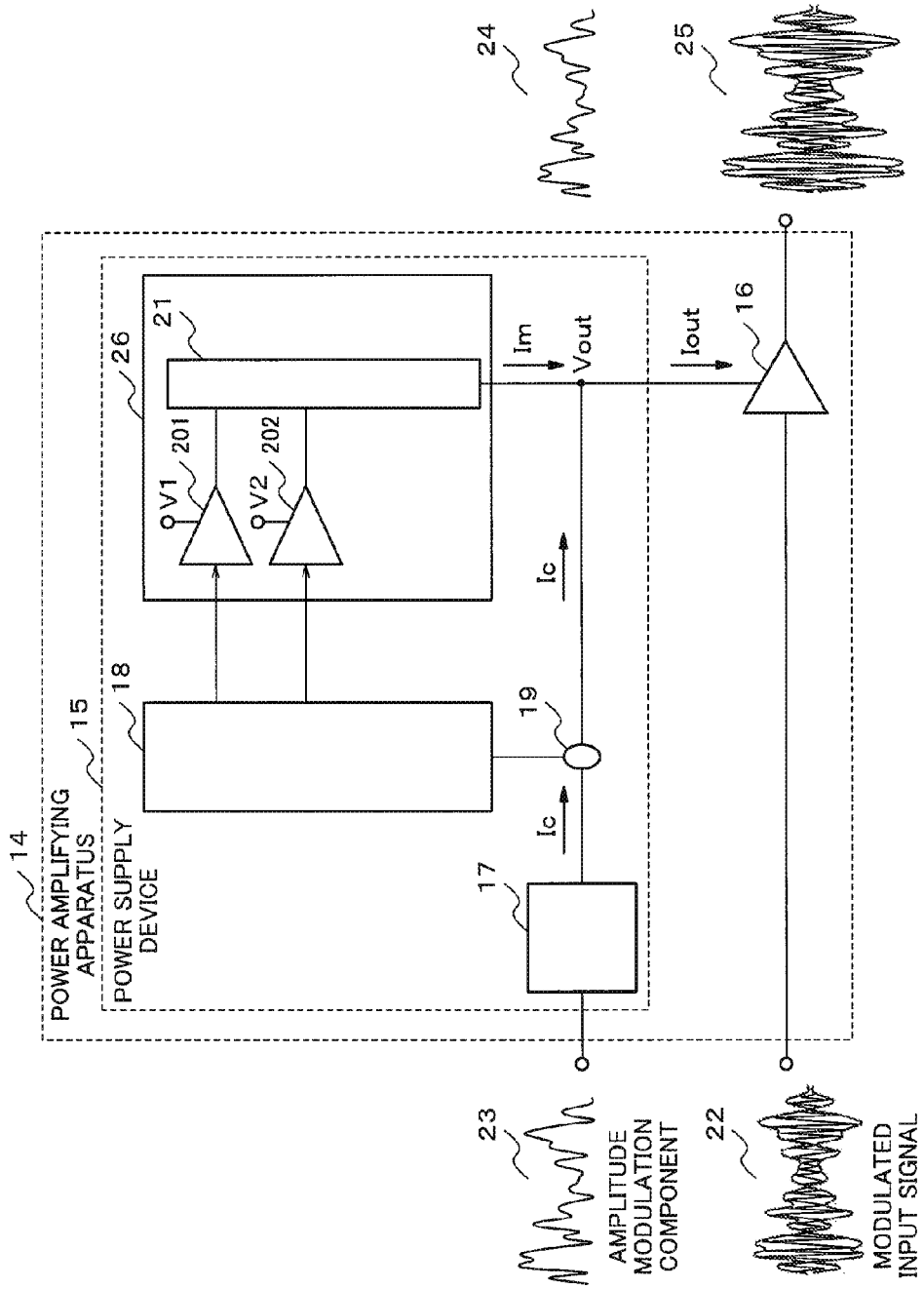
FIG. 4 an example of a circuit diagram of a power amplifying apparatus 14 according to the second exemplary embodiment of the present invention.

Hereinafter, detail description will be given of operation of the power supply device of the present exemplary embodiment, using an example comprising two switching amplifiers and a combining unit. FIG. 4 shows an example of a block diagram of a power supply device configured with two switching amplifiers. Here, it is assumed that the lower limit value is smaller than zero and the n-number of threshold values are all larger than zero.

In a power supply device 15 of the present exemplary embodiment, a relation Ic=Iout−Im holds at an output port Vout. When current flows out from a linear amplifier unit 17 (Ic>0), that is, when the current Ic is larger than the lower limit value, a control signal generation unit 18 switches on switching amplifiers 201 and 202 depending on the slew rate of an amplitude modulation component 23, and thus brings them into electrical connection to power supplies V1 and V2, respectively. Specifically, when the slew rate of the amplitude modulation component 23 is low, only the switching amplifier 201 is brought into the conducting state, and consequently a switching voltage Vsw=V1 is outputted. On the other hand, when the slew rate of the amplitude modulation component 23 is high, both of the switching amplifiers 201 and 202 are brought into the conducting state, and consequently a switching voltage Vsw=V1+V2 is outputted.

When the output current Im is excessively supplied with respect to the output current Tout supplied to a power amplifier 16, the current Ic gradually decreases. Then, when the current Ic becomes smaller than the lower limit value, the control signal generation unit 18 brings both of the switching amplifiers 201 and 202 into the non-conducting state. Accordingly, by a principle of switching converter, current is supplied from GND to the power amplifier 16.

In the power supply device 15 of the present exemplary embodiment, performed is self-excited oscillation which repeats the above-described operation, depending on a flowing magnitude of the output current Ic. Further, the slew rate of the output current Im is changed according to the slew rate of the amplitude modulation component 23, and thus, the switching frequency is always adjusted to be at an optimum. Accordingly, because high-speed switching operation is not performed unnecessarily for a low slew rate signal, efficiency degradation due to increase in switching noise and that in switching loss, which are caused by the unnecessary high-speed switching, can be suppressed. Further, for a high slew rate signal, because the output current Im with a high slew rate is supplied, it is possible to follow even a steep peak and thus to suppress current increase at the linear amplifier unit 17 with low efficiency.

In this way, for an input signal with a varying slew rate, performed is control by which the slew rate of current from the switching amplifying unit 26 becomes high and low in a high and a low slew rate regions, respectively, of the input signal. Accordingly, the switching frequency can be changed according to the slew rate of an input signal.

As a result, even when adjustment is made to a high slew rate, it is possible to prevent that the switching frequency becomes unnecessarily too high in a low slew rate region, which gives rise to increase in switching noise and switching loss and consequent decrease in power efficiency. Further, even when adjustment is reversely made to a low slew rate, it is possible to avoid that the switching current becomes deficient in a high slew rate region, which gives rise to increase in current at the linear amplifier unit 17, consequent degradation in power efficiency, and occurrence of waveform distortion due to deficiency in current at the linear amplifier unit 17. This is because an optimum relation between current at the switching amplifying unit 26 and that at the linear amplifier unit 17 can always be kept.

Further, in general, the switching amplifying unit has a trade-off relation between breakdown voltage and on-resistance in terms of high-speed operation. Because the output voltage Vout generated in the power supply device according to the present exemplary embodiment is a total of voltages of the respective switching amplifiers (=V1+V2+ ... +Vn), no high voltage is applied to the individual switching amplifier. As a result, the switching speed of the switching amplifiers is easy to be increased, and accuracy of their following an input signal waveform can thus be improved. Further, because their on-resistances are low and it is thus easy for them to perform ideal switching operation with no overlap of current and voltage, the power efficiency can be increased. Furthermore, because it is enough to have one common current detection unit, loss due to the current detection unit can be suppressed to a minimum necessary amount.

In this way, by arranging the power supply device 15 of the present exemplary embodiment as a power supply in the power amplifying apparatus 14, only a minimum necessary amount of power is always supplied to the power amplifier 16 according to change in the amplitude of a modulated input signal. Further, since the waveform of a modulated input signal can be accurately followed, the power amplifier 16 can prevent occurrence and mixing of waveform distortion. Accordingly, compared to the case of operation at a constant voltage, higher power efficiency can be achieved for the whole power amplifying apparatus. Furthermore, since the output voltage of the power supply device 15 can follow an input signal with high accuracy, the power amplifying apparatus 14 of the present exemplary embodiment can keep high linearity in its output signal.

That is, by employing the configuration described above, it is possible to obtain a power supply device with high efficiency and low waveform distortion, and a power amplifying apparatus with high efficiency and high linearity, which uses the device as a power supply.

Although, in the present exemplary embodiment, description has been given of the case where the switching amplifying unit is configured with two switching amplifiers, similar effect is obtained also when three or more switching amplifiers are comprised.

Third Exemplary Embodiment

Figure 5:
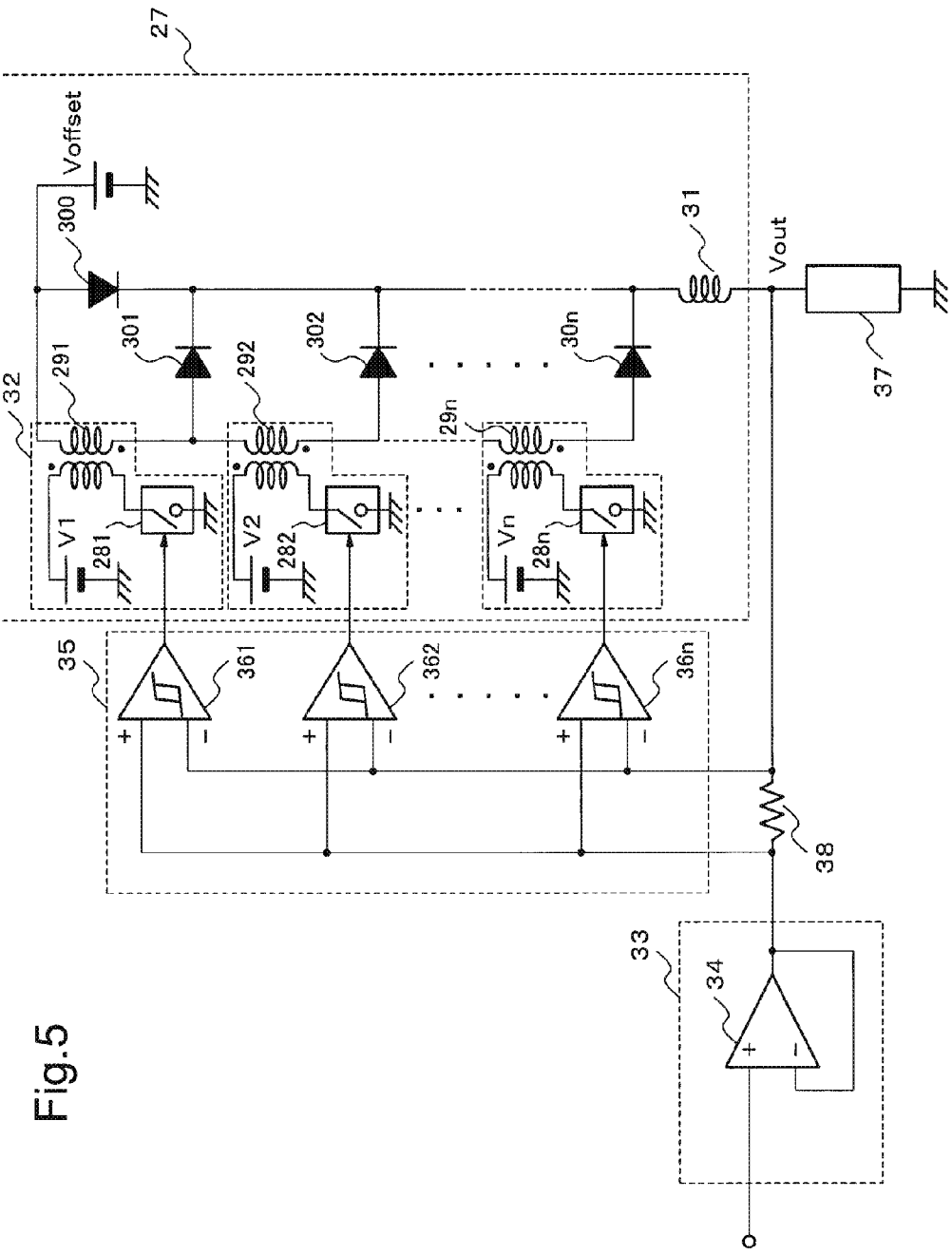
FIG. 5 an example of a circuit diagram of a power supply device according to a third exemplary embodiment of the present invention.

A third exemplary embodiment will be described below. FIG. 5 shows an example of a circuit diagram of a power supply device according to the present exemplary embodiment. The power supply device according to the present exemplary embodiment comprises a linear amplifier unit 33, a control signal generation unit 35 and a switching amplifying unit 27.

The linear amplifier unit 33 is composed of an operational amplifier 34 configuring a voltage follower. The control signal generation unit 35 is composed of a plurality of hysteresis comparators 361, 362, ..., 36n (n: a natural number equal to or larger than 2).

The switching amplifying unit 27 comprises n number of switching amplifiers 32 (n: a natural number equal to or larger than 2), diodes 300, 301, ..., 30n, an inductor 31 and a second DC (direct-current) power supply Voffset.

The switching amplifiers 32 comprises respective switching elements 281, 282, ..., 28n (n: a natural number equal to or larger than 2), respective transformers 291, 292, ..., 29n, and respective first DC power supplies V1, V2, ..., Vn. The first DC power supply V1 is connected to one end of the primary coil of a transformer 291, and the switching element 281 is arranged between the other end of the primary coil of the transformer 291 and GND. Further, a first port of the secondary coil of the transformer 291 is connected to the second DC power supply Voffset. Then, one end of each of the diodes 300, 301, ..., 30n is connected to the secondary coil of the corresponding switching amplifier, and the other end of each of the diodes is connected to the inductor 31.

Figure 6:
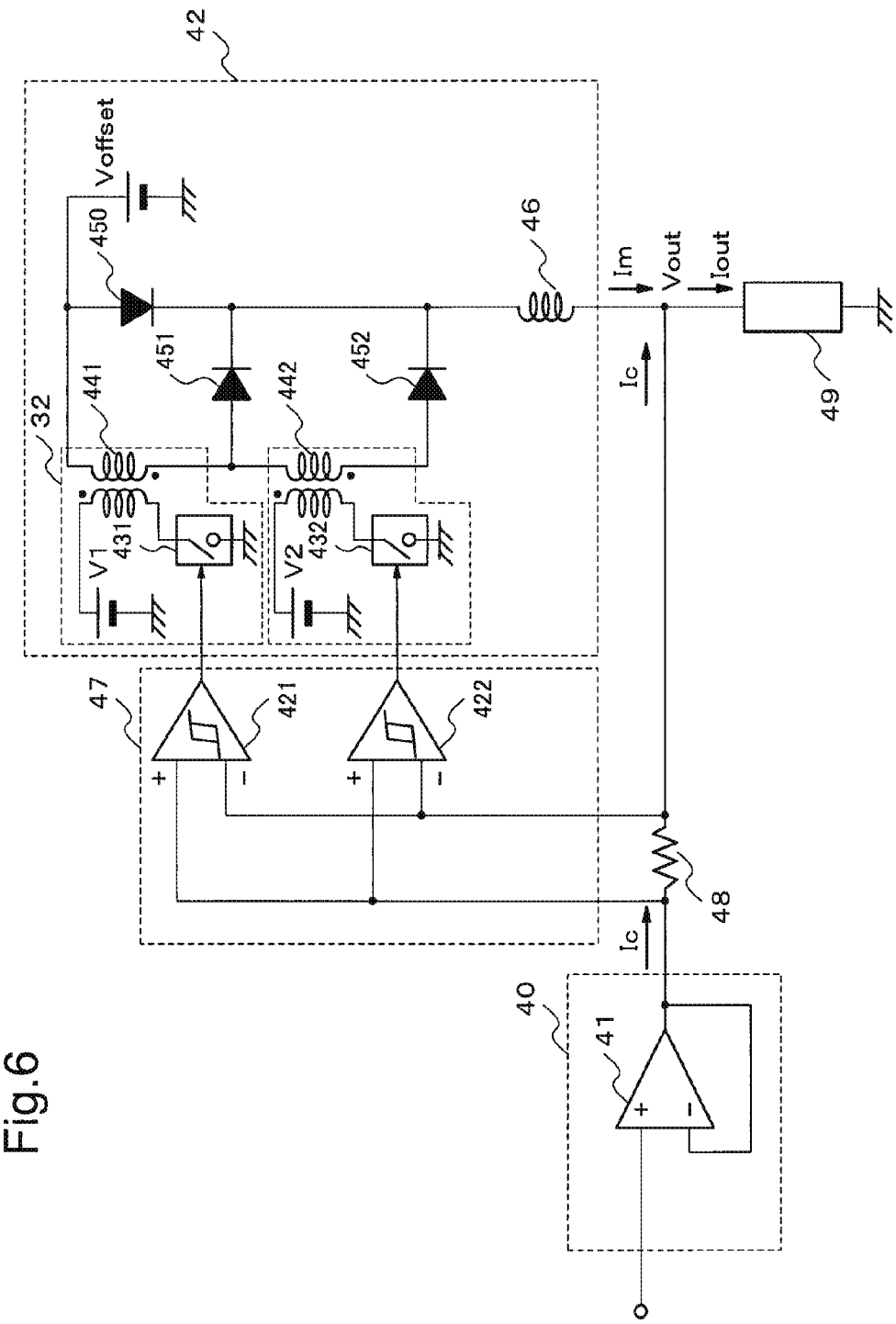
FIG. 6 an example of a circuit diagram of a power supply device according to the third exemplary embodiment of the present invention.

Next, description will be given of operation of the power supply device according to the present exemplary embodiment. Hereinafter, description will be given of the case where the power supply device is configured with two hysteresis comparators and two switching amplifiers. FIG. 6 shows an example of a circuit diagram of a power supply device configured with two hysteresis comparators and two switching amplifiers. Here, assumed is a relation between voltages at the respective switching amplifiers and a sum of the voltages to be V1=V2=V0/2 and Voffset=0V.

In FIG. 6, when an amplitude modulation component is inputted to an operational amplifier 41 configuring a voltage follower, the operational amplifier 41 converts the amplitude modulation component into an operational amplifier current Ic, and outputs it. The operational amplifier current Ic outputted from the operational amplifier 41 is inputted to hysteresis comparators 421 and 422 via a current detection unit 48. By selecting the polarity of the hysteresis comparators 421 and 422 such that their outputs become High and Low when the operational amplifier current Ic is larger and smaller, respectively, than a predetermined lower limit value, the outputs become pulse width modulated signals according to the intensity of the inputted amplitude modulation component.

Figure 7:
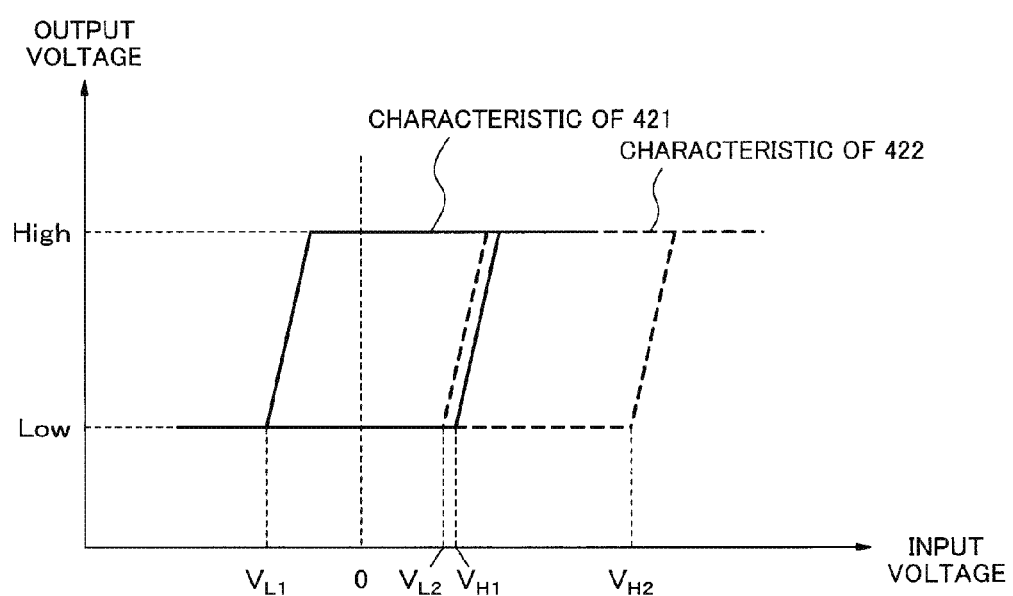
FIG. 7 an example of output characteristics of hysteresis comparators 421 and 422 of a power supply device according to the third exemplary embodiment of the present invention.

FIG. 7 shows an example of a relation between threshold values of the hysteresis comparators 421 and 422 in the power supply device of the present exemplary embodiment.

When low-voltage side and high-voltage side threshold values for the hysteresis comparators 421 and 422 are respectively represented by (VL1, VH1) and (VL2, VH2), the threshold values are set to satisfy VH2>VH1 and VL2>VL1. Further, the predetermined lower limit value described above is set at a smaller value than VL1. In the following description, it is assumed for simplicity that the lower limit value equals to VL1, and that VH1=VL2, but this condition does not need to be satisfied necessarily.

Figure 8:
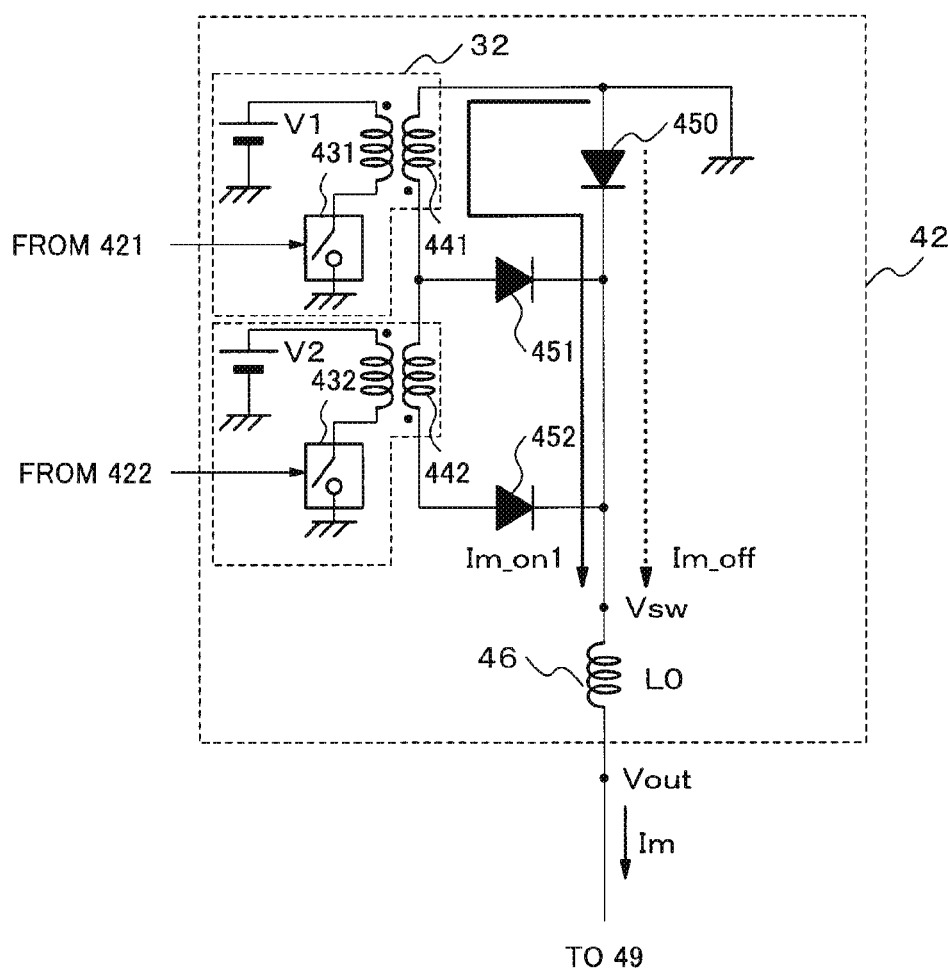
FIG. 8 a diagram showing an example of a current flow in a switching amplifying unit 42 of the power supply device according to the third exemplary embodiment of the present invention.
Figure 9A:
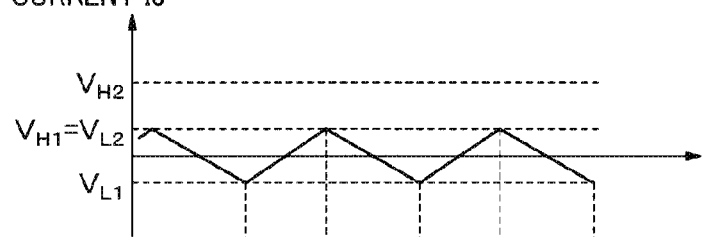
FIG. 9 a diagram schematically showing an example of voltage and current waveforms in the power supply device according to the third exemplary embodiment of the present invention.

Here, description will be given of a current flow and voltage waveforms of when the slew rate of an inputted amplitude modulation component is low, using FIGS. 8 and 9. FIG. 8 shows an example of a circuit diagram of a switching amplifying unit 42 illustrating a current flow of when the slew rate of an amplitude modulation component is low, and FIG. 9 shows an example of current and voltage waveforms during operation. FIGS. 9(a), (b) and (c) show respectively an example of a characteristic of an operational amplifier current Ic outputted from the operational amplifier 41, that of a switching voltage Vsw at the cathode position of a diode 451 and that of a switching current Im supplied to a power amplifier 49.

As shown in FIG. 9(a), when the operational amplifier current Ic increases to reach the high-voltage side threshold value VH1 of the hysteresis comparator 421, a pulse width modulated signal outputted from the hysteresis comparator 421 becomes High. This High pulse width modulated signal is inputted, as shown in FIG. 8, to the gate of a switching element 431 composed of, for example, an MOSFET, and thus brings the switching element 431 into the ON state (conducting state). One port of the switching element 431 is grounded, and the other port is connected to a power supply V1 (=V0/2) via the primary coil of a transformer 441. Via the switching element 431, current flows from the power supply V1 to the primary side of the transformer 441.

Figure 9B:
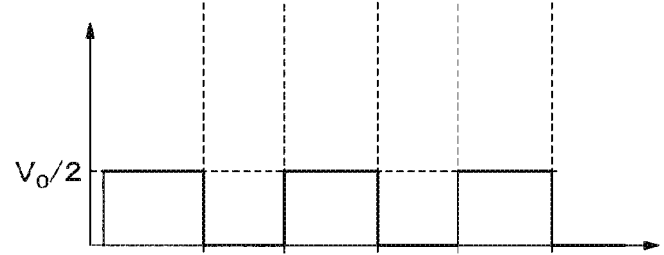

Electrical power stored in the transformer 441 is transferred to the secondary coil, and a current Im_on1 flows from a power supply at the secondary side, Voffset (GND), toward the direction of the power amplifier 49, which is a load of the power supply device, via the secondary coil of the transformer and the diode 451. At that time, assuming the turns ratio between the primary and secondary coils of the transformer 441 to be 1:1, then, as shown in FIG. 9(b), a voltage of Vsw=V0/2 is generated at the cathode of the diode 451. Further, a switching current Im is supplied to the power amplifier 49 via an inductor 46.

If the inductance of the inductor 46 is represented by L0, the slew rate of the switching current Im_on1 is given approximately as follows.

$$\frac{dI_{m\_on1}}{dt} = \frac{(V_{SW} - V_{OUT})}{L_0} = \frac{(V_0/2 - Vout)}{L_0} \quad \text{(equation 1)}$$

Figure 9C:
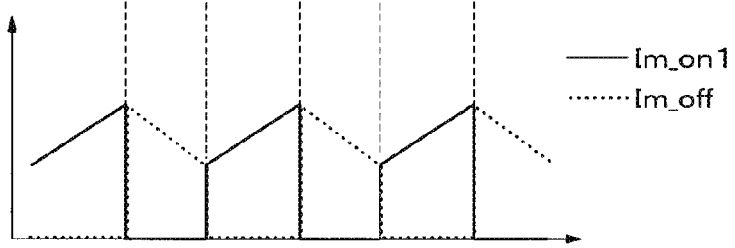

Because Ic=Iout−Im holds at an output port Vout of the power supply device of the present exemplary embodiment, when the switching current Im becomes excessive with respect to an output current Tout flowing through the power amplifier 49, the operational amplifier current Ic starts flowing in the direction to flow into the operational amplifier 41. In FIG. 9(a), when the operational amplifier current Ic becomes smaller than the low-voltage side threshold value VL1 (=the lower limit value) of the hysteresis comparator 421, the polarity of the hysteresis comparator 421 reverses, and the switching element 431 enters the OFF state (non-conducting state). At that time, at the secondary side of the transformer 441, in order to keep current flowing through the inductance 46, a current Im_off flows from GND to the power amplifier 49 via a diode 450. Further, because the switching element 431 and a switching element 432 are both in the OFF state (non-conducting state), the switching voltage Vsw at the cathode of the diode 450 becomes 0V as shown in FIG. 9(b). In this way, when the slew rate of an amplitude modulation component is low, the above-described switching operation is repeated and, as shown in FIG. 9(c), Im_on1 and Im_off are alternately supplied to the power amplifier 49.

Figure 10:
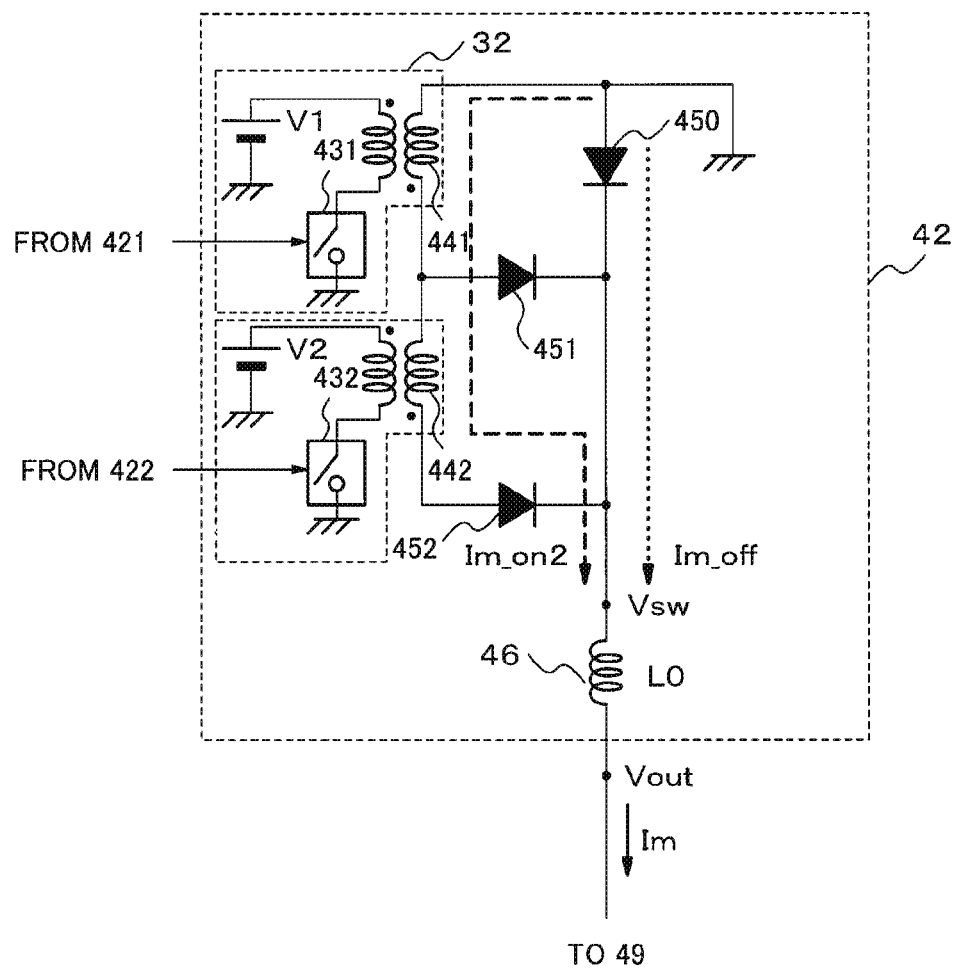
FIG. 10 a diagram showing an example of a current flow in the switching amplifying unit 42 of the power supply device according to the third exemplary embodiment of the present invention.
Figure 11A:
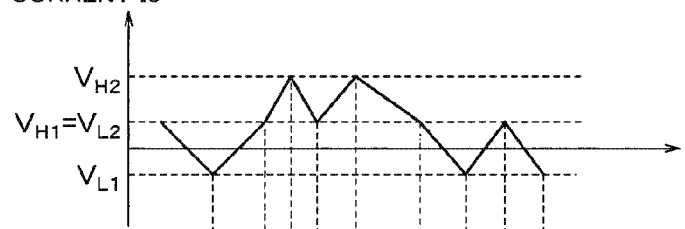
FIG. 11 a diagram schematically showing an example of voltage and current waveforms in the power supply device according to the third exemplary embodiment of the present invention.

Next, for when a slew rate is high, current flow and voltage waveforms in the present exemplary embodiment will be described, using FIGS. 10 and 11. FIG. 10 shows an example of a circuit diagram of the switching amplifying unit 42 illustrating a current flow of when the slew rate of an amplitude modulation component is high, and FIG. 11 shows an example of current and voltage waveforms during operation. FIGS. 11(a), (b) and (c) show respectively a characteristic of the operational amplifier current Ic, that of the switching voltage Vsw, and that of the switching current Im.

During the time period where the slew rate of an amplitude modulation component is small and the slew rate of an output current Tout according to it is smaller than a slew rate of the switching current Im given by the above-described equation 1, because the operational amplifier current Ic does not exceed the high-voltage side threshold value VH2 of the hysteresis comparator 422, as shown in FIG. 11(a), the switching element 442 is kept in the non-conducting state. Accordingly, a transformer 442 connected in series to the transformer 441 is in the op en state, and thus no current flows there.

On the other hand, when the slew rate of an amplitude modulation component is large and the slew rate of the output current Tout according to it becomes larger than a slew rate of the switching current Im_on2 given by the equation 1, the operational amplifier current Ic becomes larger than the high-voltage side threshold value VH2 of the hysteresis comparator 422, as shown in FIG. 11(a). In this case, as shown in FIG. 10, a pulse width modulated signal outputted from the hysteresis comparator 422 becomes High, in addition to that from the hysteresis comparator 421, and thus both of the switching elements 431 and 432 are brought into the ON state (conducting state).

Figure 11B:
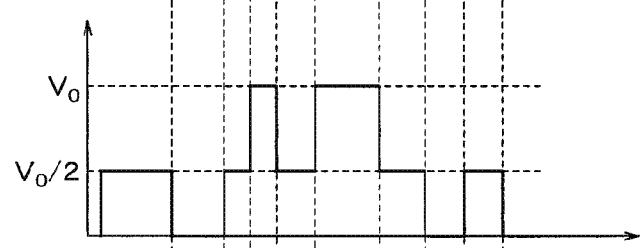

At that time, current flows from a power supply V2 (=V0/2) to the primary side of the transformer 442 via the switching element 432, and the stored electrical power is transferred to the secondary coil. Since one end of the secondary coil of the transformer 442 is connected to one end of the secondary coil of the transformer 441, the current Im_on2 flows from GND toward the direction of the power amplifier 49, which is a load, via the secondary coil of the transformer 441, the secondary coil of the transformer 442 and a diode 452. At that time, assuming the turns ratio between the primary and secondary coils to be 1:1 for both of the transformers 441 and 442, voltage of Vsw=V0/2+V0/2=V0 is generated at the cathode of the diode 452, as shown in FIG. 11(b). Because the diode 451 is subjected to reverse voltage, no current flows through it.

The switching current Im_on2 is supplied to the power amplifier 49 via the inductor 46. At that time, a slew rate of Im_on2 is given approximately as follows.

$$\frac{dI_{m\_on2}}{dt} = \frac{(V_{SW} - V_{OUT})}{L_0} = \frac{(V_0 - Vout)}{L_0} \quad \text{(equation 2)}$$

Because a relation Ic=Iout−Im holds at the output port Vout of the power supply device of the present exemplary embodiment, when the switching current Im is supplied in almost the same amount as the output current Tout, the operational amplifier current Ic starts decreasing. When the operational amplifier current Ic becomes smaller than the low-voltage side threshold value VL2 of the hysteresis comparator 422, the polarity of the hysteresis comparator 422 reverses, and thus the switching element 432 is brought into the OFF state (non-conducting state). If the operational amplifier current Ic is still higher than the low voltage side threshold value VL1 of the hysteresis comparator 421, the switching element 431 is kept in the ON state, and the switching voltage Vsw becomes V0/2 as shown in FIG. 11(b).

In this case, as shown in FIG. 8, the current Im_on1 is supplied to the power amplifier 49 via the secondary coil of the transformer 441 and the diode 451. When the operational amplifier current Ic further decreases to become smaller than the low-voltage side threshold value VL1 of the hysteresis comparator 421, the switching element 431 also is brought into the OFF state, and thus the switching voltage Vsw becomes 0V as shown in FIG. 11(b). At that time, at the secondary side of the transformers 441 and 442, in order to hold current flowing through the inductor 46, the current Im_off flows from GND to the power amplifier 49 via the diode 450.

Figure 11C:
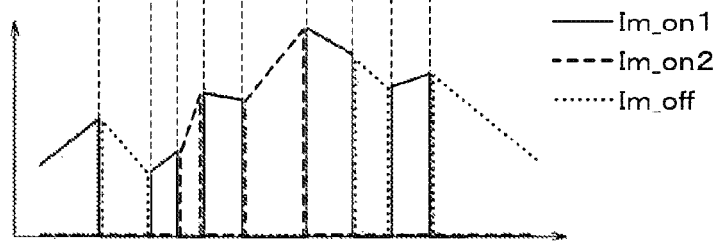

In the way described above, switching operation is repeated according to the slew rate of an input signal, and, as shown in FIG. 11(c), any one of Im_on1, Im_on2 and Im_off is supplied as the switching current Im to the power amplifier 49.

As described above, in the power supply device according to the present exemplary embodiment, the slew rate of the output current Im changes according to the slew rate of an amplitude modulation component. Because high-speed switching operation is not performed unnecessarily for a low slew rate signal, increase in switching noise and that in switching loss due to such operation are suppressed. Further, for a high slew rate signal, because the output current Im with a high slew rate is supplied, even a steep peak can be followed.

Further, if the low-voltage and high-voltage side threshold values of i-th hysteresis comparator are represented by VLi and VHi (i=1, 2, ..., n−1; n: a natural number equal to or larger than 2), respectively, by setting them as VH(i+1)>VHi and VL(i+1)>VLi, the switching amplifiers 32 are switched in a stepwise manner according to the slew rate of an amplitude modulation component. In this case, it is possible to suppress occurrence of transient instability in the output of the power supply device at the time of switching of the switching amplifiers 32.

Figure 12A:
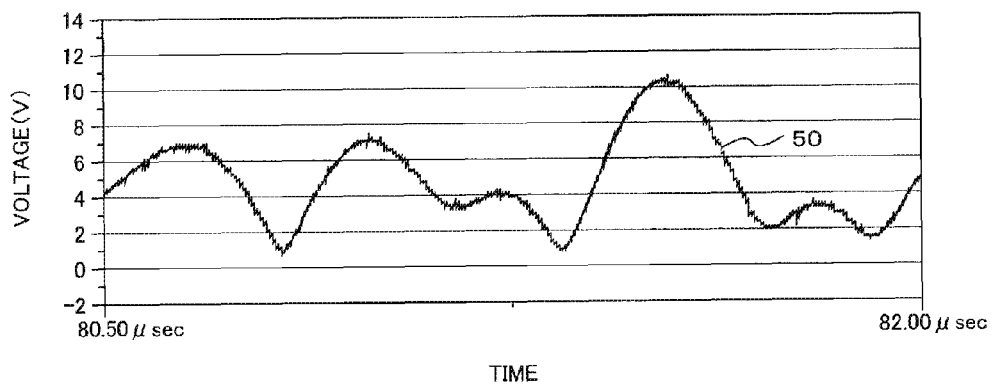
FIG. 12 an example of an operational waveform in the power supply device according to the third exemplary embodiment of the present invention.
Figure 12B:
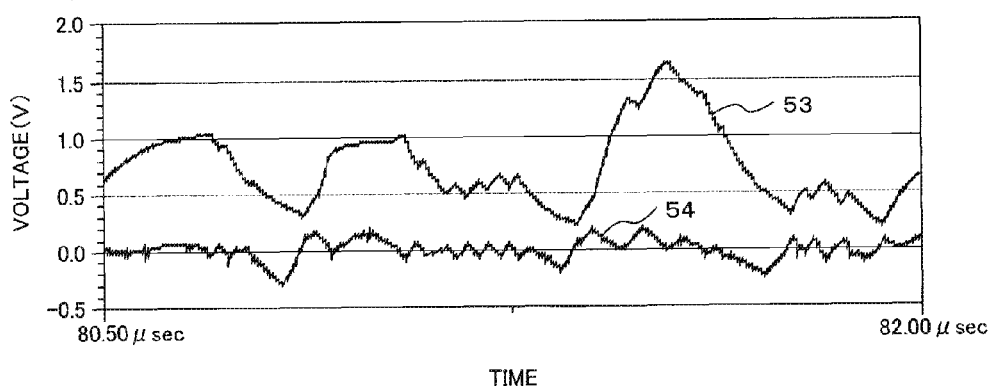
Figure 12C:
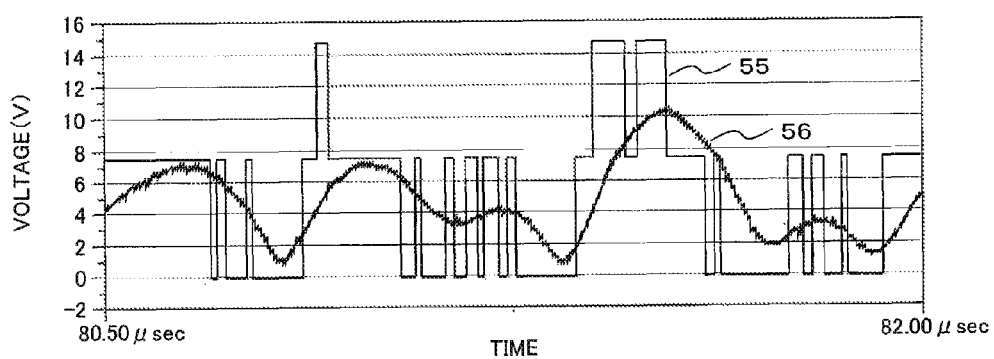
Figure 13A:
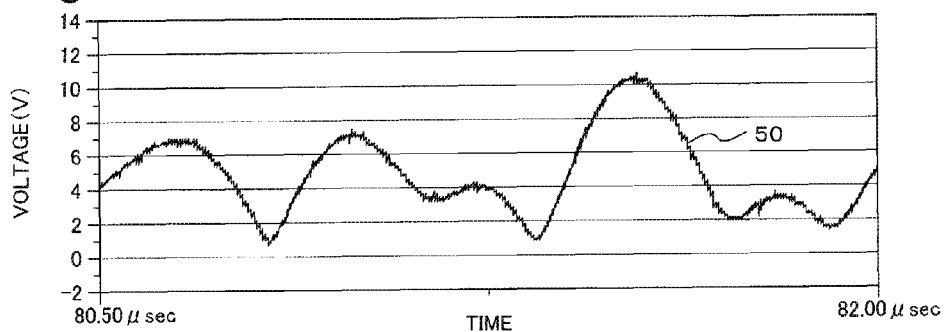
FIG. 13 an example of an operational waveform in a power supply device according to a comparative example 1.
Figure 13B:
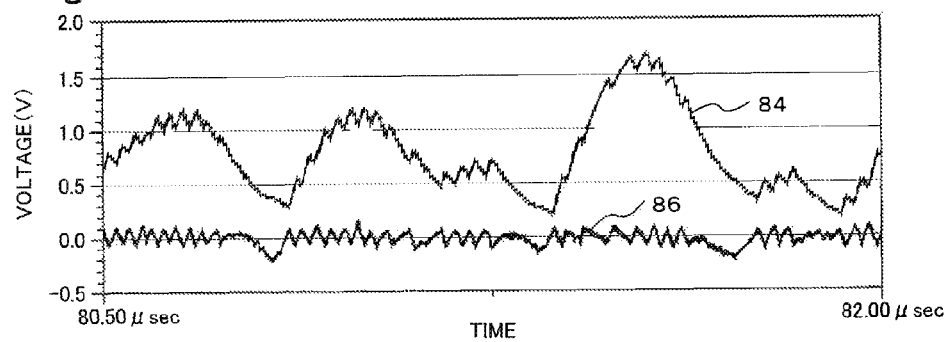
Figure 13C:
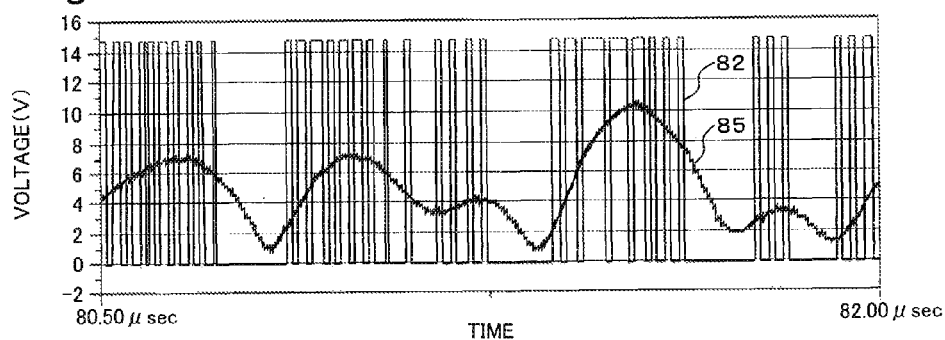
Figure 14A:
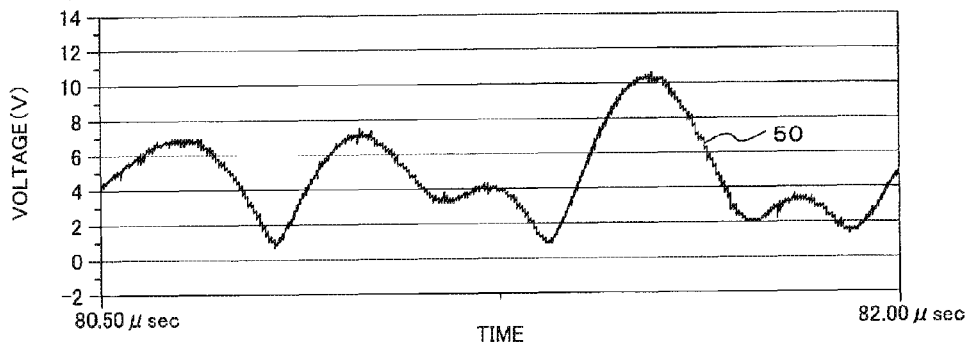
FIG. 14 an example of an operational waveform in a power supply device according to a comparative example 2.
Figure 14B:
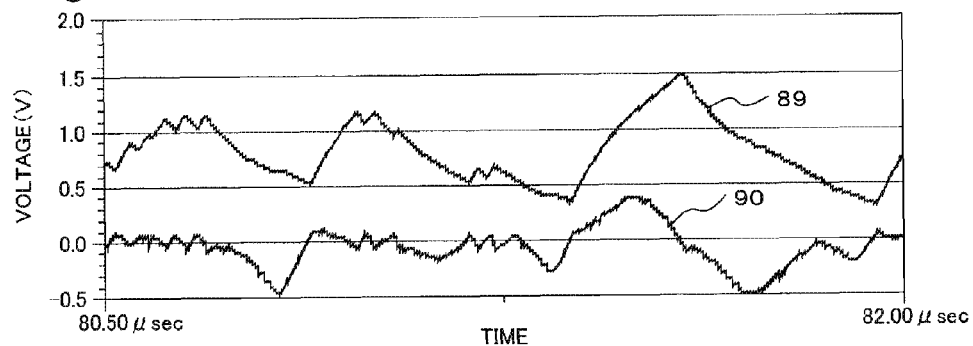
Figure 14C:
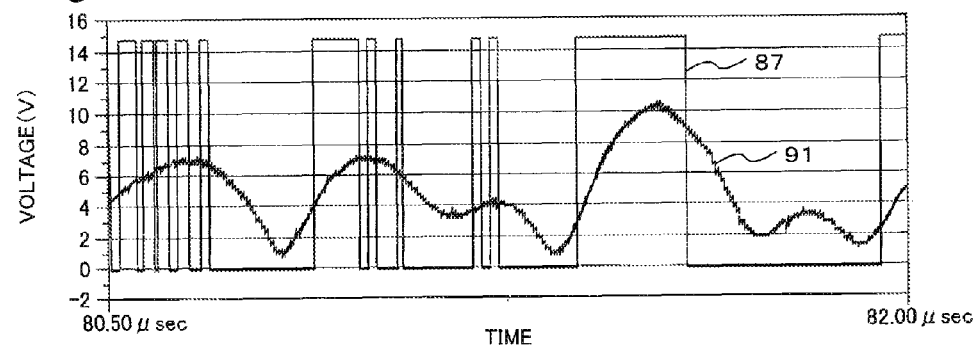
Figure 16:
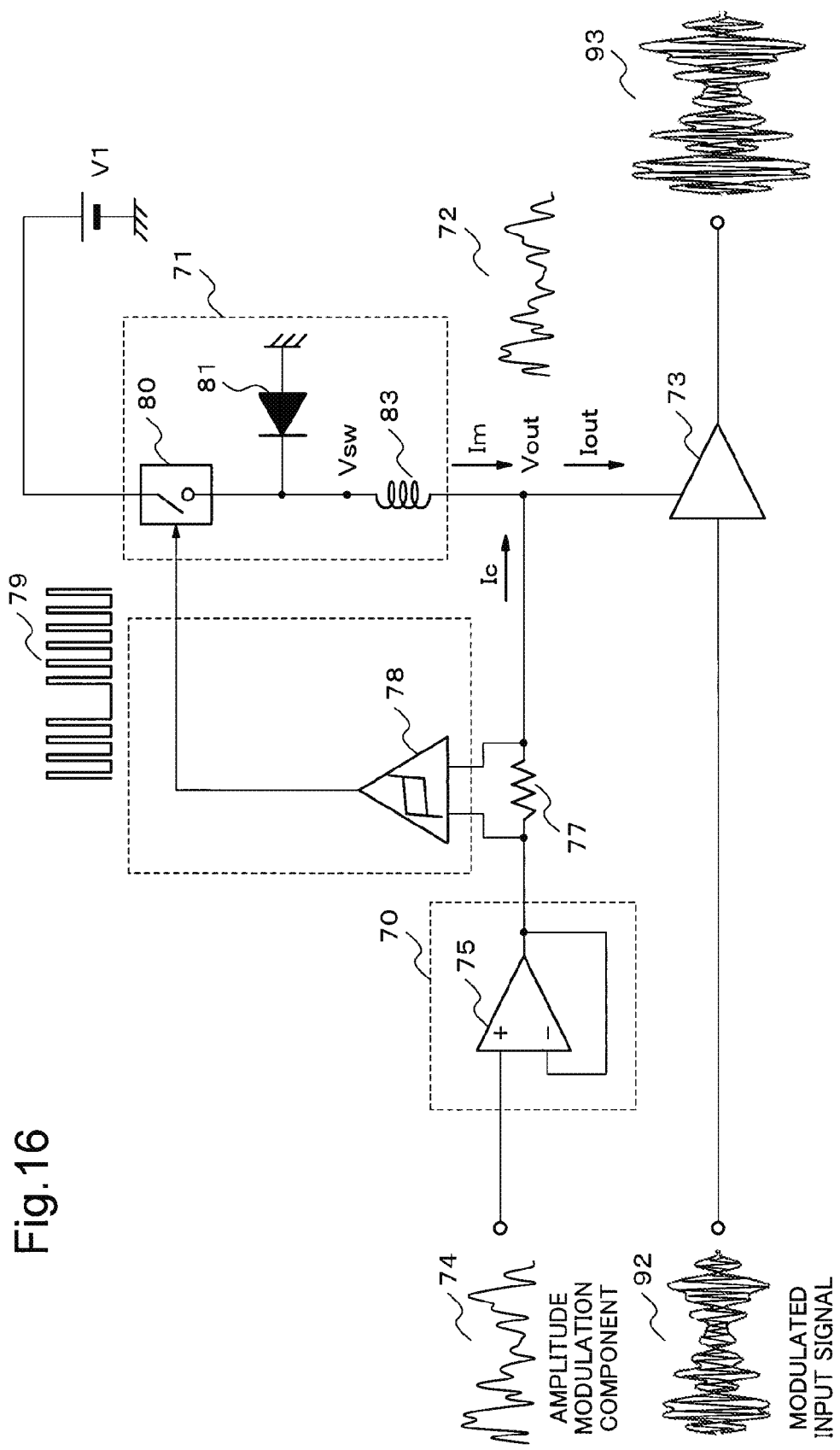
FIG. 16 a circuit diagram of a modulation power supply device of non-patent document 3.
Figure 17:
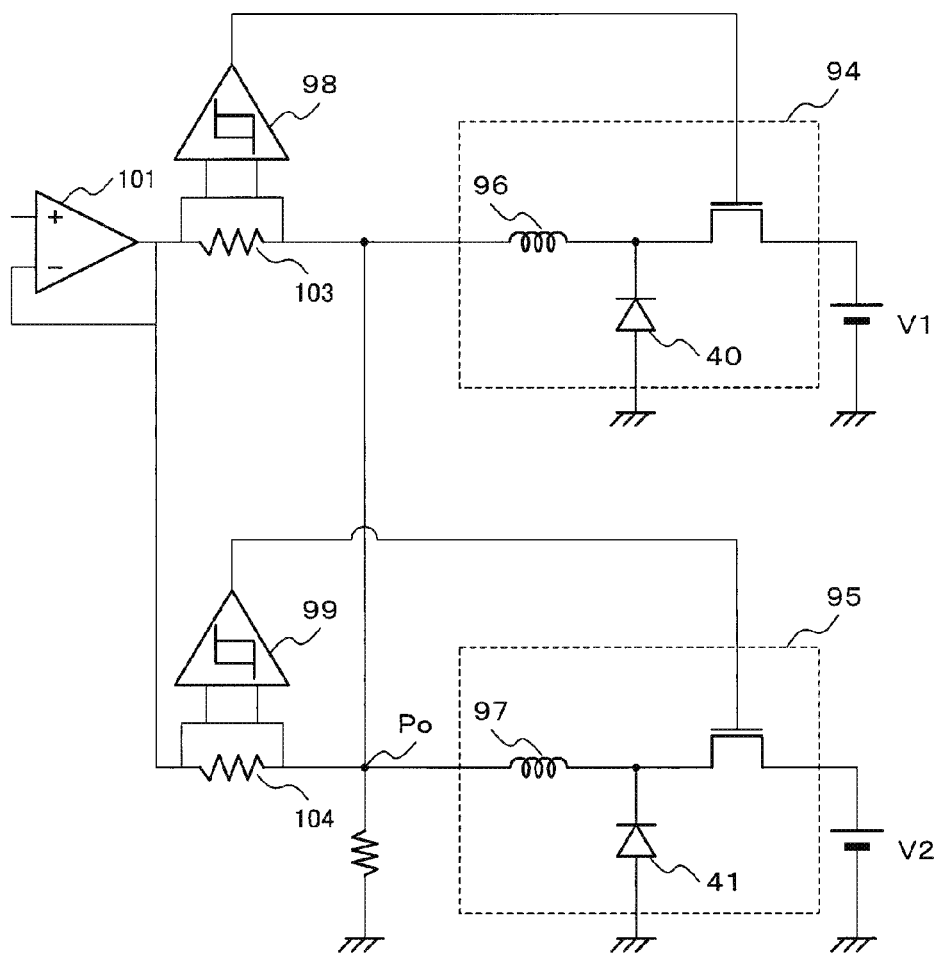
FIG. 17 a circuit diagram of a power supply circuit of patent document 1.

The following description will be given of the case where an envelope (amplitude signal) of a WCDMA downlink signal is inputted to the power supply device of the present exemplary embodiment. An example of operational waveforms in the power supply device according to the present exemplary embodiment is shown in FIG. 12(a)-(c). As a comparative example 1, FIG. 13(a)-(c) shows an example of operational waveforms in the power supply device (FIG. 16)

of non-patent document 3 described in Background Art. Further, as a comparative example 2, FIG. 14(a)-(c) shows an example of operational waveforms in a power supply device corresponding to the power supply device in FIG. 16 where the inductance of the inductor 83 is doubled.

Here, It is assumed that the inductance of the inductor 46 in the power supply device according to the present exemplary embodiment and that of the inductor 83 in the power supply device of the comparative example 1 are both set as L0=0.6 µH, and that of the inductor in the power supply device of the comparative example 2 as L0=1.2 µH. Also assumed is the power supply voltage as V0=15V.

First, the comparative example 1 (FIGS. 13 and 16) will be described. In FIG. 16, when current flows out from the linear amplifier unit 70 of non-patent document 3 (the comparative example 1), the pulse width modulated signal 79 becomes High. At that time, as shown in FIG. 13(c), a switching voltage (Vsw) 82 becomes V0 (=15V). Passing through the inductor 83, current from the switching element 80 is integrated and becomes a switching current (Im) 84 from which a switching frequency component has been removed.

On the other hand, when the switching current Im becomes excessive with respect to the output current Tout flowing into the power amplifier 73, the operational amplifier current Ic starts decreasing. Then, when the operational amplifier current Ic becomes smaller than a predetermined threshold value, the polarity of the hysteresis comparator 78 reverses, and thus the pulse width modulated signal 79 becomes Low, and the switching element 80 enters the OFF state (non-conducting state). At that time, in order to hold current flowing through the inductor 83, the current Im flows from GND to the power amplifier 73 via the diode 81. At the same time, as shown in FIG. 13(c), the switching voltage (Vsw) 82 becomes 0V.

The above-described switching operation is repeated, and thus the switching current (Im) 84 is supplied to the power amplifier 73 alternately from V0 and from GND. Although switching current (Im) 84 includes an error component due to switching, voltage correction is performed by the linear amplifier unit 70, and accordingly the output voltage 85 shown in FIG. 13(c) is supplied to the power amplifier 73 in the form where the waveform of the amplitude modulation component 50 is accurately reproduced and amplified.

In this case, in order to improve the efficiency of the power supply device of the comparative example 1, it is desirable to set the switching frequency of the switching element 80 to be as higher as possible than the frequency bandwidth of the amplitude modulation component, reduce a switching error included in the switching current (Im) 84, and reduce current flowing through the operational amplifier 75. Specifically, it is desirable to set the slew rate of the switching current (Im) 84 to be higher than the slew rate of the output current Tout according to the amplitude modulation component.

However, when this power supply device is applied to a high power apparatus such as, for example, a cellular phone base station, the power supply voltage V0 becomes tens of volts, but, in general, high-speed, low-loss switching of such a large amplitude signal is difficult. Further, in order to correct a switching error, the bandwidth of the linear amplifier unit 70 composed of the operational amplifier 75 needs to be set to be sufficiently larger than the switching frequency, but it is also not easy to hold a bandwidth of tens of MHz simultaneously with amplitude of tens of volts.

In view of this, in order to lower the switching frequency, the inductance value of the inductor 83 is set to be 2×L0 (=1.2 µH) for the power supply device of the comparative example 2. Operation of the power supply device of the comparative example 2 will be described below using FIG. 14(a)-(c).

As shown in FIG. 14(c), the switching frequency of the switching voltage (Vsw) 87 is reduced by about half compared to the switching frequency of the switching voltage (Vsw) 82 of the comparative example 1 (L0=0.6 µH) shown in FIG. 13. Further, in a region where the slew rate of the amplitude modulation component 50 shown in FIG. 14(a) is low, the switching frequency is at a proper value, but in a peak region where the slew rate of the amplitude modulation component 50 is high, the slew rate of the switching current (Im) 89 shown in FIG. 14(b) is lower than the slew rate of the amplitude modulation component 50.

In this case, in a peak region, in order to reproduce the waveform of the amplitude modulation component 50, large operational amplifier current (Ic) 90 needs to be supplied from the linear amplifier unit 70, as shown in FIG. 14(b), and thus the efficiency of the whole power supply device decreases. Further, when current supplying ability of the operational amplifier 75 constituting the linear amplifier unit 70 is insufficient, reproduction of the waveform in a peak region becomes impossible, and thus waveform distortion occurs in the output voltage 91 shown in FIG. 14(c).

On the contrary, in the power supply device according to the present exemplary embodiment, in a region where the slew rate of the amplitude modulation component 50 of a modulated input signal shown in FIG. 12(a) is low, because only the switching element 431 enters the ON state, the pulse height of a switching voltage (Vsw) 55 shown in FIG. 12(c) becomes V0/2 (=7.5V). Compared with the comparative examples 1 and 2 operating at V0 (=15V), because the switching voltage (Vsw) 55 becomes a half, the slew rate of a switching current (Im) 53 given by the equation 1 shown before becomes about a half, as shown in FIG. 12 (b), in spite of the same L0 (=0.6 µH). As a result, an average switching frequency also becomes about a half, and accordingly it is possible to suppress the problems of the comparative example 1, which are increase in loss at the switching elements caused by a too high switching speed, and increase in noise caused by bandwidth deficiency of the operational amplifier.

On the other hand, in a peak region where the slew rate of the amplitude modulation component 50 is high, the switching elements 431 and 432 both enter the ON state, and as shown in FIG. 12(c), the switching voltage (Vsw) 55 becomes V0 (=15V). At that time, as shown in FIG. 12(b), the slew rate of the switching current (Im) 53 given by the equation 2 shown before becomes high. As a result, because the switching current (Im) 53 can follow even a steep peak, increase in the operational amplifier current (Ic) 54 is suppressed, as shown in FIG. 12(b), in a peak region of the amplitude modulation component 50, and also suppressed are degradation resulting from it in the efficiency and that in distortion characteristics.

In other words, in the power supply device according to the present exemplary embodiment, depending on the slew rate of the amplitude modulation component 50, the output inductance changes equivalently to 2×L0 when the slew rate is low, and to L0 when the slew rate is high, and thus it becomes possible to always provide optimum switching current and an optimum switching frequency.

An output voltage 56 shown in FIG. 12(c), which is obtained in this way, can reproduce the waveform of the amplitude modulation component 50 with high accuracy, and can supply electrical power to the power amplifier with high power efficiency. Further, because the use of the obtained output voltage as a power source of the power amplifier results in that only minimum necessary power is supplied from the power supply device according to the amplitude of a modulated input signal, the power amplifier can be used always at around a saturation region giving high efficiency, and thus increase in power efficiency of the whole system also becomes possible.

Further, although description has been given here of the case of comprising two switching amplifiers, the same effect is obtained in the case of three or more switching amplifiers, since the basic principle is common to both cases.

Furthermore, although description has been made here using the case of V1=V2=V0/2 and Voffset=0V, voltages V1, V2, ..., Vn given to the switching amplifiers and the offset voltage Voffset given to the secondary coil of a transformer may be optionally designed depending on a system. For example, in a WCDMA downlink signal and an OFDM signal, PAPR is large and an occurrence frequency of a large peak power with respect to an average power is small. For such signals, by setting V1+Voffset to be around the average power, only the switching element 431 operates most of the time, and the switching element 432 occasionally operates. By this way, because loss due to switching can be reduced on average, efficiency of an entire system is also improved.

Further, turns ratios of the transformers 441, 442, ..., 44n may be optionally designed depending on a system.

Modification Example of the Third Exemplary Embodiment

Figure 15:
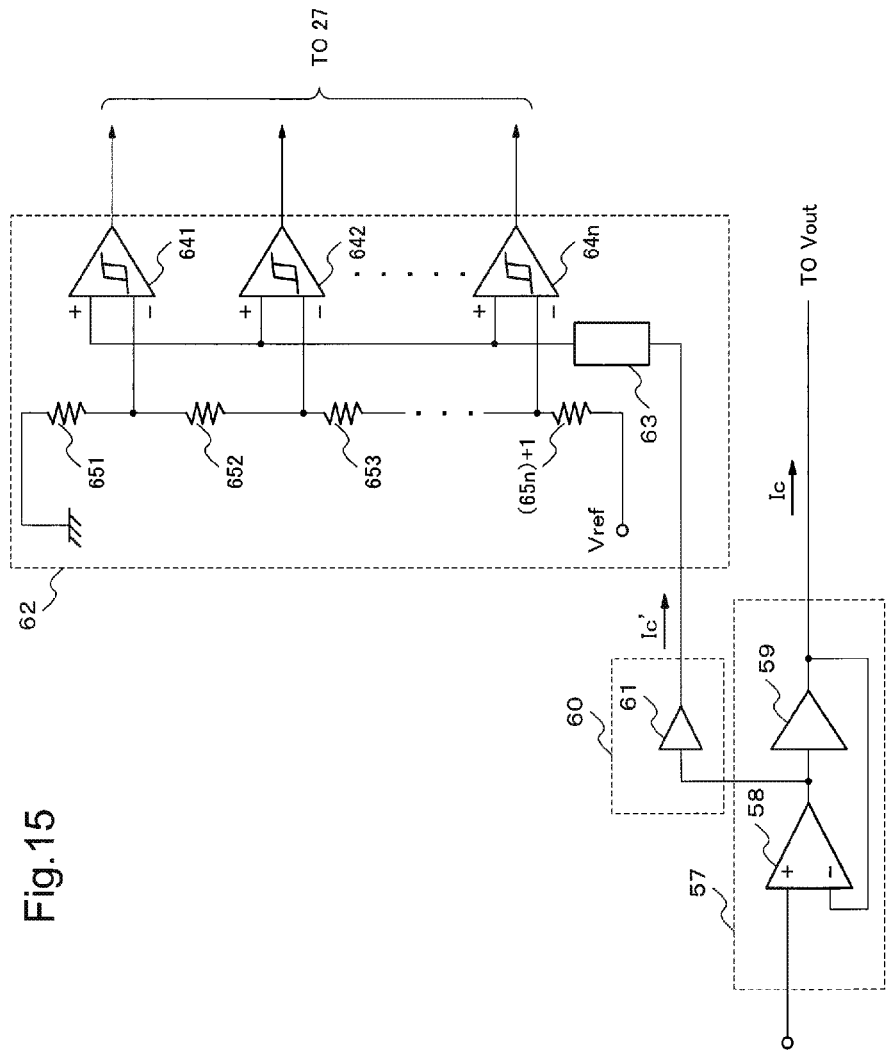
FIG. 15 an example of a circuit diagram of a power supply device according to a modification example of the third exemplary embodiment of the present invention.

A modification example of the third exemplary embodiment will be described below. FIG. 15 shows an example of a circuit diagram illustrating a configuration of a power supply device according to a modification example of the present exemplary embodiment. FIG. 15 corresponds to the linear amplifier unit 33, the control signal generation unit 35 and the current detection unit 38 in FIG. 5 described in the third exemplary embodiment.

In FIG. 15, the linear amplifier unit 57 comprises an operational amplifier 58 and a first buffer amplifier 59 connected to the output of the operational amplifier 58, and has a voltage follower configuration where negative feedback is returned from the output of the first buffer amplifier 59 to the input of the operational amplifier 58. A current detection unit 60 comprises a second buffer amplifier 61 connected to the output of the operational amplifier 58 in parallel with the first buffer amplifier 59, and the second buffer amplifier 61 has a configuration obtained by scaling the first buffer amplifier 59 in size, and outputs an output current which is proportional to, and sufficiently smaller than, an operational amplifier current Ic outputted from the first buffer amplifier 59.

The output current Ic' is inputted to a control signal generation unit 62. In the control signal generation unit 62, the output current Ic' is converted into voltage by a current to voltage converter 63, which is a resistor element or the like, and the resulting voltage is inputted to one input port of each of hysteresis comparators 641, 642, ..., 64n (n: a natural number equal to or larger than 2). The other input ports of the hysteresis comparators 641, 642, ..., 64n are connected respectively to n number of contact ports which are arranged on the line between a reference voltage Vref and GND by resistance dividing the line with (n+1) number of resistor elements 651, 652, ..., 65n+1 connected in series on the line.

If the low-voltage side and high-voltage side threshold values of i-th hysteresis comparator are represented respectively by VLi and VHi (where, VHi>VLi, i=1, 2, ..., n−1; n: a natural number equal to or larger than 2), when they are set to have relations VH(i+1)>VHi and VL(i+1)>VLi, the number of hysteresis comparators outputting High increases with increasing the operational amplifier current Ic outputted from the linear amplifier unit 57. High or Low pulse width modulated signals outputted from the hysteresis comparators 641, 642, ..., 64n are inputted to the switching amplifying unit 27 shown in FIG. 5. Basic operation after that is similar to that in the power supply device of the third exemplary embodiment described using FIGS. 6 to 11.

By employing such a configuration, it becomes unnecessary to provide a current detection unit shown in the second and third exemplary embodiments on a main path for a flow of the operational amplifier current Ic supplied to a load. Although, in order to keep loss due to a potential drop to a minimum, a resistor of as small as less than 1Ω is generally used in the current detection unit, the output impedance of the power supply device is increased even when the resistance is so small. Therefore, it is desirable not to arrange a current detection unit on a main flow path of the operational amplifier current Ic.

Further, because a resistor of a small resistance is large in size and difficult to realize with high accuracy, it raises problems of size and variability. On the contrary, in the power supply device according to the present exemplary embodiment, because the buffer amplifier 61 and the current to voltage converter 63 for current detection are not arranged on the main path and are dedicated to the current detection use, a design margin can be large.

Although the preferred embodiments of the present invention have been described above, they have been presented just as examples, and in no way limit the present invention. Various modifications may be made in the present invention within a range not departing from the spirit of the present invention.

This application insists on priority based on Japanese Patent Application No. 2010-113793 proposed on May 18, 2010 and takes everything of the disclosure here.

INDUSTRIAL APPLICABILITY

As an example of an application of the present invention, mentioned is a transmission apparatus used in a terminal and a base station for a cellular phone, a wireless LAN and a WiMAX, and in a terrestrial digital broadcasting station.

DESCRIPTION OF SYMBOL 1, 14, 100 power amplifying apparatus
2, 15, 200 power supply device
3, 16, 37, 49, 73, 300 power amplifier
4, 17, 33, 40, 57, 70, 400 linear amplifier unit
5, 18, 35, 47, 62 control signal generation unit
6, 26, 27, 42 switching amplifying unit
7, 19, 38, 48, 60, 77, 103, 104 current detection unit
9, 21 combining unit
10, 22, 92, 700 modulated input signal
11, 23, 50, 74, 720 amplitude modulation component
12, 24, 56, 72, 85, 91, 710 output voltage
13, 25, 93, 710 high frequency modulated signal
31, 46, 83, 96, 97 inductor
32, 201, 202, 801, 802, 80n switching amplifier
80, 281, 282, 28n, 431, 432 switching device
34, 41, 58, 75, 101 operational amplifier
51, 52, 5n control signal
53, 84, 89 switching current
54, 86, 90 operational amplifier current
55, 82, 87 switching voltage
59 first buffer amplifier
61 second buffer amplifier 63 current to voltage converter
71, 94, 95 switching converter unit
78, 98, 99, 361, 362, 36n, 421, 422, 641, 642, 64n hysteresis comparator
79 pulse width modulated signal
81, 301, 302, 30n, 450, 451, 452 diode
291, 292, 29n, 441, 442 transformer
500 switching amplification control unit
601, 602, 60n switching amplifying section
651, 652, 653, (65n)+1 resistor element

What is claimed is:

1. A power supply device comprising:
a linear amplifier unit configured to linearly amplify an input signal and produce a first electric current; and
a switching amplification control unit configured to output a second electric current based on voltages output by a plurality of switching amplifying units in the switching amplification control unit,
wherein:
the number of switching amplifying units switched on is based on the first electric current, and
the power supply device generates an output voltage according to a waveform associated with the input signal, and a third electric current comprising the first electric current and the second electric current.

2. The power supply device according to claim 1,
wherein if the first electric current produced by the linear amplifier unit is less than a predetermined lower limit-value, the switching amplification control unit prevents the switching amplifying units from outputting the voltages.

3. The power supply device according to claim 2,
wherein the switching amplification control unit store a plurality of threshold values, each of which corresponds to an output voltage associated with the switching amplifying units, and each of which are larger than the lower limit value; and
wherein, if the magnitude of the first electric current is greater than a threshold value, the switching amplification control unit sends a signal instructing the corresponding switching amplifying unit to output the predetermined voltage, and if the magnitude of the first electric current is less than the threshold value, the switching amplification control unit sends a signal instructing the corresponding switching amplifying unit not to output the predetermined voltage.

4. The power supply device according to claim 3, further comprising:
a plurality of hysteresis comparators each of which generates a first output signal if the magnitude of the first electric current is larger than the threshold value, and generates a second output signal if the magnitude of the first electric current is smaller than the threshold value; and
wherein each of the plurality of switching amplifying units outputs the voltage if a first output signal is input from a corresponding hysteresis comparator, and does not output the predetermined voltage if a second output signal is input from a corresponding hysteresis comparator.

5. The power supply device according to claim 4,
further comprising a plurality of hysteresis comparators wherein each hysteresis comparator has a low-voltage and high-voltage threshold value, and wherein none of the high-voltage threshold values are the same, and none of the low-voltage threshold values are the same.

6. The power supply device according to claim 1,
wherein the switching amplification control unit comprises an inductor that aggregates the voltages output from the plurality of switching amplifying units, and converts the aggregated voltage into the second electric current.

7. The power supply device according to claim 1,
wherein the linear amplifier unit is either a voltage follower or a negative feedback amplifier, and
a feedback signal is obtained from an output port of the linear amplifier unit.

8. The power supply device according to claim 1 further comprising:
a resistor arranged in series on an output path of said linear amplifier unit;
wherein the switching amplification control unit detects the magnitude of the first electric current output from the linear amplifier unit by detecting a potential drop at the resistor.

9. The power supply device according to claim 7,
wherein the linear amplifier unit comprises, a first output buffer amplifier connected to a voltage follower or negative feedback amplifier, and a second buffer amplifier connected in parallel to an input port of the first output buffer amplifier,
wherein the output of the first buffer amplifier is input to an output port of the switching amplification control unit, and
wherein the output of the second buffer amplifier is input to an input port of the switching amplification control unit.

10. A power amplifying apparatus for amplifying a modulated input signal comprising an amplitude modulation component and a phase modulation component, which comprises:
the power supply device according to claim 1, which outputs an output voltage in response to an input signal corresponding to the amplitude modulation component; and
a high frequency amplifier, that outputs an amplified input signal by modulating the input signal, and is powered by the output voltage output from the power supply device.

11. A power supply device according to claim 9, wherein the size of the second buffer amplifier is determined by adjusting the size of the first buffer amplifier.

* * * * *